United States Patent [19]

Dumoulin

[11] Patent Number: 4,706,024
[45] Date of Patent: Nov. 10, 1987

[54] SUPPRESSION OF NON-COUPLED SPINS IN NMR IMAGING AND SPECTROSCOPY

[75] Inventor: Charles L. Dumoulin, Ballston Lake, N.Y.

[73] Assignee: General Electric Company, Schenectady, N.Y.

[21] Appl. No.: 859,528

[22] Filed: May 5, 1986

[51] Int. Cl.$^4$ .............................................. G01R 33/20
[52] U.S. Cl. ..................................... 324/309; 324/311
[58] Field of Search ......................... 324/309, 311, 312

[56] References Cited

U.S. PATENT DOCUMENTS 4,570,119  2/1986  Wehrli et al. ........................ 324/309
4,583,044  4/1986  Case et al. ............................ 324/312

OTHER PUBLICATIONS

Dixon, W. T., "Simple Proton Spectroscopic Imaging", Radiology, 1984; 153, pp. 189-194.

Primary Examiner—Jerry W. Myracle
Assistant Examiner—Kevin D. O'Shea
Attorney, Agent, or Firm—Geoffrey H. Krauss; James C. Davis, Jr.; Marvin Snyder

[57] ABSTRACT

A method for suppressing undesired NMR response signals from uncoupled resonances while obtaining desired NMR signals from a sample containing like nuclei which are coupled to one another, precedes each NMR response-signal-evoking excitation signal sequence with a pulse sequence having radio-frequency (RF) pulses providing a 90° rotation of the spin magnetization about a first axis and then providing a 180° degree rotation of the spin magnetization about a second axis, substantially orthogonal to the first axis, in the plane of magnetization rotation, prior to the alternating presence of a second 90° RF pulse causing rotation about the first axis prior to the start of an associated imaging sequence. Time intervals T, of substantially alike duration related to the coupling constant J of the coupled nuclei, occur between each of the pulses; that one of the alternating sequences which is devoid of the second 90° RF pulse has a pair of consecutive time intervals T occurring between the consecutive 180° pulses. The response signal data of a second one of a sequential set is subtracted from the first set of data, to cause suppression of uncoupled resonance response signals. The suppression of water resonance response data obtained by this method is substantially independent of chemical shift, spin-lattice coupling $T_1$ and spin-spin coupling $T_2$.

20 Claims, 7 Drawing Figures

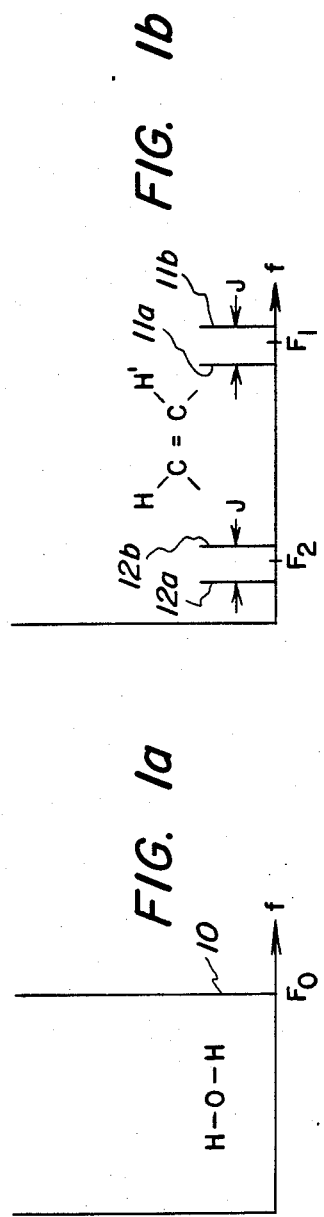
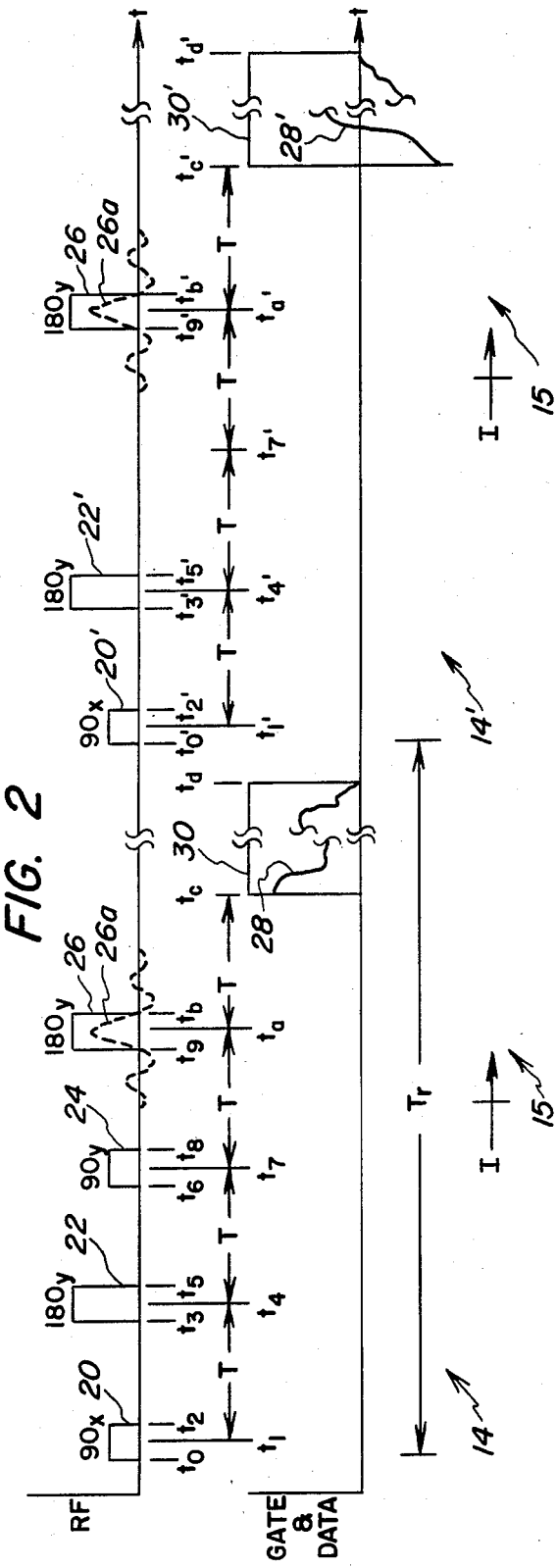

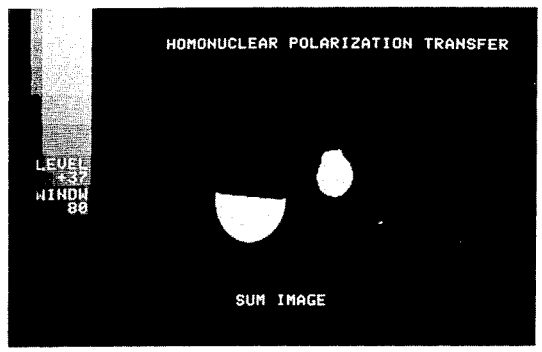
FIG. 4a
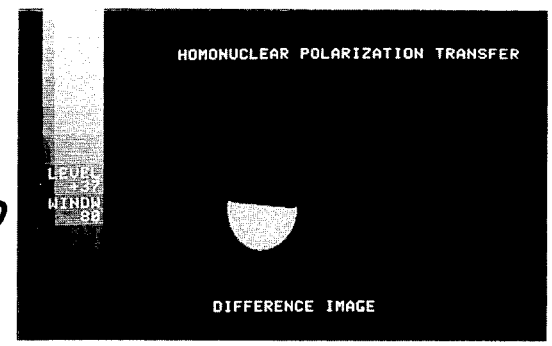
FIG. 4b
FIG. 5
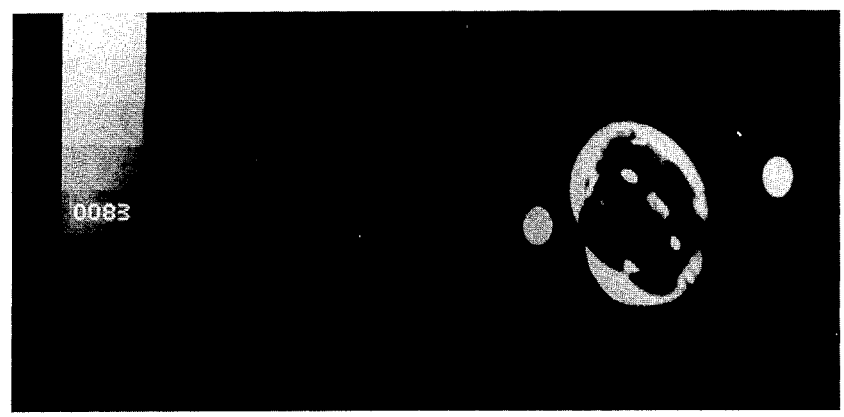

SUPPRESSION OF NON-COUPLED SPINS IN NMR IMAGING AND SPECTROSCOPY

BACKGROUND OF THE INVENTION

The present invention relates to nuclear magnetic resonance (NMR) imaging and spectroscopy and, more particularly, to novel methods for suppression of water, and other non-coupled-spin, resonance response signals by utilizing homonuclear polarization transfer techniques.

Nuclear magnetic resonance (NMR) imaging and spectroscopy presently appear to hold great promise for medical diagnostic purposes. The hydrogen ($^1H$) nucleus is perhaps the most readily observed, in present NMR imaging, due to its high gyromagnetic ratio and natural abundance. Most of the large amount of $^1H$ nuclei, in biological systems, are contained in water molecules. Therefore, it is considerably easier to measure the amount, spin-lattice relaxation time $T_1$ and spin-spin relaxation time $T_2$ of water in biological systems, then to measure the amount, $T_1$ and $T_2$ of other $^1H$ containing molecular species. While the observation of the natural-occurring concentration of metabolites is well within the capability of modern NMR imaging systems, the response signals from excited water molecules prove to be so intense, in practice, as to render other response signals substantially unobservable. Therefore, it is highly desirable to selectively eliminate the response signals from $^1H$ nuclei in water, to allow the much smaller-amplitude response signals from other $^1H$ molecules, arising from important components in biological samples, to be readily observed.

PRIOR ART

Suppression of the water response signal in NMR spectra has hitherto been an area of great activity. Water suppression techniques generally fall into one of two categories: selective excitation to avoid stimulation of the water resonance in the first instance; or elimination of the response signals, from excited water resonances, at the time of response signal data acquisition. In the latter category, the water resonance is usually either selectively saturated or is inverted and sufficient time allowed for the resonance to evolve (in $0.693T_1$ of the water resonance) so that essentially zero amplitude response signals are provided by the water resonance during acquisition of data from another $^1H$ resonance. In practice, however, these methods do not provide total suppression and frequently distort the desired spectrum in the region of the water resonance. A review of existing water suppression techniques, for higher resolution spectroscopy, was presented recently in "Solvent Suppression in Fourier Transform Nuclei Magnetic Resonance" by P.J. Hore, at 55 J. Magn. Reson. 283(1983).

It is also well known to utilize an inverse DEPT pulse sequence to transfer polarization from hetronuclei, such as from $^{13}C$ nuclei to $^1H$ nuclei. Since the INEPT sequences do not work with homonuclear resonances, and the other methods, with the possible exception of $T_1$ nulling techniques, tend to discriminate against the chemical-shift of water resonances, and are therefore not especially useful of achieving suppression of water NMR response signals in NMR images, a method for obtaining responses from $^1H$ homonuclear resonances, for NMR imaging and spectroscopy, is highly desirable.

BRIEF SUMMARY OF THE INVENTION

In accordance with the invention, a method for suppressing undesired NMR response signals from uncoupled resonances while obtaining desired NMR signals from a sample containing like nuclei which are coupled to one another, comprises the step of preceding each NMR response-signal-evoking excitation signal sequence with a pulse sequence having radio-frequency (RF) pulses providing a 90° rotation of the spin magnetization about a first axis and then providing a 180° degree rotation of the spin magnetization about a second axis, substantially orthogonal to the first axis, in the plane of magnetization rotation, prior to the alternating presence of a second 90° RF pulse causing rotation about the second axis prior to the start of an associated imaging sequence. Time intervals T, of substantially alike duration related to the coupling constant J of the coupled nuclei, occur between each of the pulses; that one of the alternating sequences which is devoid of the second 90° RF pulse has a pair of consecutive time intervals T occurring between the consecutive 180° pulses. The response signal data of a second set of a sequential pair of data sets is subtracted from the first set of data, to cause suppression of uncoupled resonance response signals. The suppression of water resonance response data obtained by this method is substantially independent of chemical shift, spin-lattice relaxation time $T_1$ and spin-spin relaxation time $T_2$. The suppression factor can be multiplicatively further enhanced by combining the method of the present invention with other water suppression techniques, such as $T_1$ nulling or spin presaturation. Further suppression ratio improvement can also be obtained by cycling the phase of transmitter and receiver signals, to compensate for typical pulse imperfections.

Accordingly, it is one object of the present invention to provide a novel method for suppression of undesired uncoupled resonance NMR response signals from nuclear species and for thus enhancing the NMR response signals from coupled nuclear species resonances.

This and other objects of the present invention will become apparent to those skilled in the art, upon consideration of the following detailed description of the invention, when read in conjunction with the drawings.

BRIEF DESCRIPTION OF THE DRAWINGS

FIG. 1a is an amplitude graph, in the frequency domain, for an uncoupled (water) resonance;

FIG. 1b is an amplitude graph, in the frequency domain, for the NMR response characteristic of a pair of coupled spin-one-half ($^1H$) nuclei;

FIG. 2 is a set of time-coordinated digital waveforms for the radio-frequency excitation and the data acquisition and gating signals in one presently-preferred embodiment of the coupled resonance response signal-generating sequence, with the subsequence of the present invention, and of a spin-warp signal imaging sequence utilized therewith;

FIGS. 4a and 4b are photographs of displayed images of phantoms, taken with the methods of the present invention, and illustrating the uncoupled $^1H$ nuclei suppression; and FIG. 5 is a photograph of displayed images of a portion of the anatomy of an adult human volunteer, and useful in appreciating the present invention.

DETAILED DESCRIPTION OF THE INVENTION

Figure 3:
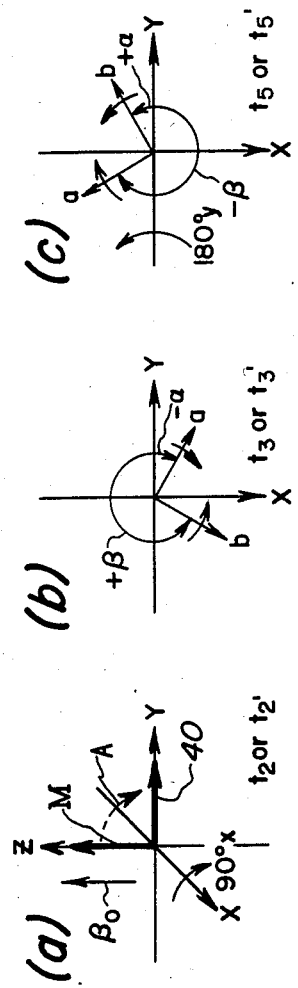
FIGS. 3a–3g and 3d'–3g' are a set of spin vector graphs useful in understanding the method of the present invention.

Referring initially to FIG. 1a, responsive to appropriate excitation, a single spectral component 10 occurs in the response signal of a molecule, such as that of water ($H_2O$), which has a plurality of $^1H$ hydrogen atoms with their nuclei not coupled to one another. Component 10 has a frequency $F_O = 2\pi\gamma B$, where $\gamma$ is the gyromagnetic ratio (about 42.58 MHz./T for $^1H$) and B is the total magnetic field encountered by the stimulated nuclei. The single spectral line 10 occurs, in a uniform B field, because the spin-½ nuclei are each isolated from, i.e. non-coupled to, non-equivalent nuclei with an odd number of nucleons. When placed in the magnetic field, there are only two energy states in which the nucleus can be found, i.e. a spin-down state with a first energy level, or a spin-up state with a second energy level. Only one possible quantum transition exists between the two possible energy levels. It is this fixed energy difference that determines the frequency, in accordance with $E = h \cdot F_O$, where h is Planck's constant.

Referring now to FIG. 1b, in a more complex molecule having a plurality of $^1H$ atoms with the nuclei thereof coupled to one another, as in an organic material having H—C=C—H groups (wherein inequivalent $^1H$ nuclei are coupled through the H—C, C=C and C—H' bonds). Each of the $^1H$ nuclei in this material is not isolated from, but may be affected by, other nuclei. If each of the nuclei, for simplicity, is considered to have a spin of one-half, the M=two possible energy states in which each of a plurality N of coupled nuclei can be found can translate, due to the coupling, into one of $M \times N = 2 \times 2 = 4$ possible conditions at any time. Thus, at any instant: both of the pair of hydrogen nuclei can be in the spin-down state; both can be in the spin-up state; the first nucleus can be spin-up while the second nucleus is spin-down; or the first nucleus can be spin-down while the second nucleus is spin-up. Four of the possible transitions between these four different energy levels provide spectral lines in the NMR response signal spectrum. The spectral line of the first nucleus becomes a doublet of spectral lines 11a and 11b, due to splitting effects of the coupled spin of the second nucleus. The second nucleus is itself responsive for another doublet, of spectral lines 12a and 12b due to the splitting effects of the coupled spin of the first nucleus. The doublet components 11a-11b or 12a-12b, are separated by a frequency separation $dF_A$ which is determined by the magnitude of the spin-spin coupling constant J and which is substantially symmetrical about the frequency $F_1$ or $F_2$ of the pair of spectral lines associated with each coupled nucleus of the coupled pair of nuclei.

It will be seen that, if the non-coupled spectral line 10 is of greater amplitude than the amplitude of any of the coupled spectral lines 11 or 12 (due to the greater relative abundance of water in the sample being investigated, relative to the organic material having the coupled protons), and if the non-coupled spectral line frequency $F_O$ is substantially close to one, or both, of the coupled spin spectral line frequencies $F_1$ and $F_2$, then the coupled nuclei response signals 11 and/or 12 can be completely overwhelmed by the non-coupled spectral line signal 10, and it will be difficult, if not impossible, to properly receive the desired coupled-nuclei response signals.

Referring now to FIG. 2, one presently preferred set of RF and response data gating signal waveforms is illustrated for my novel method for suppression of the response signal from non-coupled spins. I will illustrate the preferred signal sequence as utilized in a nuclear magnetic resonance (NMR) imaging/spectroscopy system in which a set of three mutually-orthogonal X, Y and Z axes of a Cartesian-coordinate system are present. The novel method of my invention utilizes an alternating one of a pair of non-coupled-spin suppression subsequences 14 and 14' prior to each of an associated response-signal-evoking NMR sequence 15, which may be any of a large group of imaging/spectroscopy sequences (such as a standard spin-warp excitation sequence, and the like, as known to the art). Thus, in accordance with one principle of the present invention, use of the alternating subsequences 14 and 14' provides those conditions necessary for the detection of spin magnetization of coupled spins to be reinforced, while the detection of spin magnetization of non-coupled nuclei undergo nulling, immediately prior to acquisition of the imaging response signals. This occurs responsive to only one of the subsequences having a pulse signal present therein which causes coupled spins to behave differently than non-coupled spins.

At the beginning of a subsequence/sequence set (of an alternating pair of such sets), a first RF signal pulse 20 is provided to cause the spin magnetization of at least the coupled nuclei to rotate; a rotational effect substantially equal to $\pi/2$ radians, or 90°, about a first (e.g. X) axis, is caused. The uncoupled spins are also rotated by pulse 20. This pulse signal commences at a subsequence start time $t_0$ and substantially terminates at a first pulse termination time $t_2$. The rotating spin magnetizations are allowed to dephase for a time interval T, from the midtime $t_1$ of the first pulse 20, until the midtime $t_4$ of a next-subsequent signal pulse 22. Pulse 22 is a $\pi$, or 180°, RF signal pulse, here applied for rotation about a substantially orthogonal second (e.g. Y) axis of the sampling plane. Pulse signal 22 commences at a time $t_3$ and is substantially terminated at a somewhat later time $t_5$. The interpulse time interval T is proportional to the coupling constant J and is typically substantially equal to $1/(4J)$. Another interpulse time interval T is provided from the midtime of the refocusing signal pulse 22 until the time $t_7$ at the midpoint of a second $\pi/2$, or 90°, RF signal pulse 24, for rotation about the second (Y) axis. Pulse signal 24 substantially commences at a time $t_6$ and is substantially terminated at a time $t_8$. Thereafter, another time interval T is provided until the midpoint time $t_a$ of a second $\pi$, or 180°, RF signal pulse, for rotation about the second (Y) axis. Pulse signal 26 commences the selected imaging sequence 15. This pulse may be a selective excitation pulse 26a, having a sinc, Gaussian or other form of modulated envelope, as desired. Responsive to pulse 26 or 26a, and typically to gradient pulses (not shown) for slice selection, phase encoding and other purposes, a response signal 28 is generated by the sample and is received during a subsequent response data interval, starting at a time $t_c$ which occurs at the time interval T after the midtime $t_a$ of the 180° pulse signal 26 commencing the imaging sequence 15. A gating signal 30 is presented, starting at time $t_c$ and ending at time $t_d$, to define the data acquisition time interval. The second subsequence 14'/sequence 15 of the pair commences, at time $t_0'$, after a repetition time interval $T_r$ from the start time $t_O$ of the first subsequence 14/sequence 15.

At the beginning of the alternating subsequence/sequence set, a first 90° RF signal pulse 20' commences at a subsequence start time $t_O'$ and substantially terminates at the first signal pulse termination time $t_2'$. A second signal pulse 22' is a 180° pulse which occurs after time interval T, from the midtime $t_1'$ of the first signal pulse 20' until the midtime $t_4'$ of the 180° signal pulse 22. Pulse signal 20' rotates spins about the first (X) axis and pulse 22' rotates spins about the (Y) second axis, substantially orthogonal to the first axis. After refocusing pulse 22', a pair of time intervals T are now provided. A second 180° RF signal pulse 26 or 26a starts the imaging sequence 15 of the second set. This second 180° signal pulse has its midpoint time $t_a'$ at the end of the 2T time interval. Responsive to pulse 26 or 26a, and to gradient pulses (again not shown) for slice selection, phase encoding and other purposes, another response signal 28' is generated by the stimulated nuclei of the sample. The NMR response signal 28' is received during a gating time interval, when a gating signal 30' is present, starting at a time $t_c'$ (at the end of the same time interval T after the imaging sequence commencement pulse midpoint time $t_a'$). The data acquisition time interval ends at time $t_d'$. Thereafter, a new pair of sets of subsequence/sequence signals commences after another repetition time interval $T_r$ (here, from time $t_O'$), with the presence and absence of the second 90° RF signal pulse alternating. The received data from second response signal 28' is subtracted from the first response signal 28 received data, to suppress the uncoupled (H-O-H) resonance responses. Alternatively, the first response signal data can be added to the second response signal data, to suppress the effects of coupled resonance responses.

Referring now to FIG. 3, the effect of the alternating subsequences (of the first and second subsequence/sequence sets of the pair) is illustrated. The effect is the same, in either subsequence, up until the presence or absence of the 90° y pulse signal 24. The net spin magnetization M is initially caused, by the NMR instrument static field $B_O$ in the Z axial direction, to lie substantially parallel to the Z axis (graph (a)). Responsive to the first RF pulse signal 20 or 20', the magnetization vector is rotated, in the direction of arrow A, through 90° about the X axis. Thus, after the first $\pi/2$ pulse signal, the spin magnetizations of both doublet components 11a/11b and 12a/12b are in phase in the XY plane, and are representable, at time $t_2$ or time $t_2$, by the net spin magnetization vector 40 lying essentially along the Y axis. After the first delay time interval T, essentially equal to 1/(4J), the coupled spins become 90° out of phase with one another. In graph (b), the spin magnetization vectors a and b, represent the components for only one of the doublets of FIG. 1b; the second doublet is not shown, for purposes of clarity. Thus, prior to the first 180° pulse 22 or 22', spin vector a is at a first angle, e.g. angle $-\alpha$, with respect to the +Y axis, and is also at an angle substantially equal to 90° with respect to the spin vector b of the doublet, which itself is at another angle, e.g. angle $\beta$, with respect to the +Y axis. Angles $\alpha$ and $\beta$ need not be initially equal, due to transmitter offset. If the transmitter offset is between the doublet components, then each of the spins rotates in an opposite direction; here, vector a is rotating in the clockwise direction, and vector b is rotating in the counterclockwise direction. Application of the refocussing 180°$_y$ pulse 22 or 22', at time $t_4$ or $t_4'$, results in the vectors being "flipped" through an angle of 180° about the Y axis (graph (c)). Due to the "flip" of the other pair of components, which affect these components through their coupling (which coupling is independent of magnetic field), the vectors essentially swap position, although not rotational direction, so that vector a will be at an angle of $-\beta$, where $\beta$ was the angle of vector b (with respect to the +Y axis) prior to the $\pi_y$ pulse, and vector b is now at an angle of $+\alpha$, where the other vector a was at an angle of $-\alpha$ with respect to the +Y axis prior to the $\pi_y$ pulse 22 or 22'. This 180° pulse cancels any resonance offset components produced by the spin system evolution.

At the end of the second T=1/(4J) time interval, the two doublet components a and b have been brought into anti-phase, so that an angle of 180° appears between the a and b doublet components, just prior to either of time $t_7$ or time $t_7'$. This condition is shown in graph (d), where a vector 42a and b vector 42b are in antiphase, but rotate toward the +Y axis. In graph (d'), the effect of the 90° RF signal pulse 24, at time $t_8$, acts to invert all coupled spins about the Y axis, so that coupled spins have the a vector 44a and b vector 44b rotating in directions opposite to the rotational directions of these vectors at time $t_7'$ in the alternating subsequence 14', where the second 90° RF signal pulse is not applied to the sample. Uncoupled spins are not affected by 90° RF signal pulse 24, because this pulse applies its RF magnetic field on the same axis as the spin magnetization.

Accordingly, at the start of the imaging sequence 15, when the 180°$_y$ pulse 26 or 26a commences in the case of coupled spins only during the second of the pair of subsequence/sequence sets, the vectors become positioned as shown in graph (e). The coupled spins during the first subsequence, with the 90°$_y$ present, however, are as shown in graph (e'). It will be seen that the effect of the third time interval T causes the spin vectors a and b to be different, as shown by the different angles $-\phi$ and $+\Phi$ for the a and b respective vectors for the coupled nuclei subjected to the first subsequence (graph (e')), and the $+\phi'$ and $-\theta'$ angles of the a and b respective vectors for the uncoupled spins or the coupled spins subjected to the second subsequence (graph (e)); angles $\theta$ and $\theta'$ or $\phi$ and $\phi'$ are not generally equal in magnitude or direction. The effect of the 180°$_y$ pulse 26 or 26' (effectively occurring at either time $t_b$ or time $t_b'$) is shown in graph (f) for coupled spins in the second sequence, and is shown in graph (f') for coupled spins responsive to the first subsequence. Again, the a and b vectors are in different positions, with different angles $-\phi'$ and $+\theta'$ in graph (f) and angles $-\theta$ and $+\phi$ in the graph (f') situation. Finally, after the fourth time interval T, at time $t_c$ or time $t_c'$, when the response data is first acquired, the coupled spins, in graph (g'), as subjected to the first subsequence with the intermittent second $\pi/2$ pulse present, have both spin components 46a and 46b aligned in a first direction, along the +Y axis. The coupled spins subjected to the second subsequence (without the intermittent second $\pi/2$ pulse) have magnetization vectors 48a and 48b aligned in the −Y direction, as shown in graph (g). It will seen that when the two sets of data are subtracted, the formerly opposed spins 46 and 48 (for the coupled nuclei) will now add constructively, while the uncoupled resonance response signals 48, having the same direction, will be substantially cancelled.

While response data 28 or 28' could be acquired immediately after the intermittent second 90° RF signal pulse 24, i.e. right after time $t_7$ or time $t_7'$, the individual multiplet components, however, would have intensities which alternate in sign and all signals which are not spectrally resolved would be cancelled. This is particularly important in an imaging experiment, since any inhomogeneity of either the static magnetic field or any magnetic field gradient will tend to obscure the chemical shift of the spins. Inclusion of the pair of additional T time interval delays, from times $t_7$ or $t_7'$ to the 180° pulse 26/26a, allows the multiplet components sufficient time to attain the same phase.

The water suppression factor obtained with this method is substantially independent of chemical shift, $T_1$ and $T_2$. Combining this method with other water suppression methods, such as $T_1$ null or spin presaturation, will further enhance, by multiplicative gain, the suppression factor. Use of such additional suppression techniques may cause the total procedure to become somewhat dependent on spin-lattice relaxation times or chemical shift. Improvement in the suppression factor can also be obtained by cycling the phase of the transmitter and the receiver to compensate for most RF pulse signal imperfections. Two-step and four-step phase-cycling programs can be utilized, utilizing the phase programs shown in the following table.

TABLE 1

Two and Four-Step Phase Programs

| | First pulse | Intermittent pulse | Receiver |
|---|---|---|---|
| Two Step | x | y | y |
| | x | — | −y |
| Four Step | x | y | y |
| | x | — | −y |
| | x | −y | y |
| | x | — | −y |

The extension of the two-step phase program to a four-step phase program obtains from inversion of the phase of the second 90° pulse, due to the fact that 90° and 270° pulses at time 1/(2J) will invert coupled spins, while no coupled spin inversion will occur for 0° and 180° RF signal pulses. It will be seen that the four-step phase program can be further extended, as by advancing the phase of all RF signal pulses and the receiver by 90° and repeating, to result in a 16-step phase-shift program.

The choice of time delay interval T is not particularly critical. The transfer of polarization varies sinusoidally as a function of the delay time T, and is maximized when delay time $T = N/(4J)$, where N is an odd integer greater than zero, i.e. N=1, 3, 5, .... Longer delay times, with larger N, have the advantage of providing additional water signal suppression, due to spin-spin relaxation, as the $T_2$ of water in most tissue is relatively short.

Referring now to FIGS. 4a and 4b, the photographs show respective sum and difference images, as displayed on the output screen of a 1.5T research NMR imaging system. In the top (sum) image of FIG. 4A, the image on the right is of an object phantom provided by a 1 cm. spherical vial of copper sulfate-doped water, while the left image is of a phantom object formed of a 500 ml. polyethelyne bottle approximately half full of light machine oil. Utilizing the two-step phase program at the top of Table I, and assuming a coupling constant J of about 10 Hz. (resulting in an interpulse delay time interval T of about 25 milliseconds), data was acquired with a repetition time interval $T_r$ of about 600 milliseconds. NMR response signals 28, acquired when the second $\pi/2$ pulse signal 24 was present, were stored independently of NMR response signal 28' data obtained responsive to the second subsequence 14', in the absence of the second $\pi/2$ pulse signal. The pair of images were constructed from the stored data, with the SUM image of FIG. 4A obtained by adding the data from the two separately stored data sets, to provide an image containing spin-density information only for uncoupled spins. The DIFFERENCE image of FIG. 4b was obtained by subtracting the data from the two separately-stored sets. This difference image contains spin-density information only for coupled spins. Since the hydrocarbon molecules of oil have both coupled and uncoupled spins, the oil bottle appears in both images; the water resonance, on the other hand, does not have any coupled spins and therefore is devoid of multiplet structure, so that the water vial appears only in the sum image of uncoupled spins.

Referring now to FIG. 5, a photograph, of the display in the same imaging system, shows a section through the left forearm of a human female adult volunteer. For this image, the J=10 Hz. period was again assumed, but a 1 second repetition interval $T_r$ is used. The four-step phase-cycling program at the bottom of Table I was used to cancel most pulse imperfections. The sum image, on the right, clearly shows both muscle and lipid in the arm, as well as two small bottles of doped water, each placed on a different side of the forearm and used for alignment of the pair of data sets. The difference image, on the left, contains spin-density information only for the lipids in the forearm, since muscle and water contain substantially only uncoupled spins; thus, only the lipid in the subdural fat, and the bone marrow, towards the center of the two forearm bones, are visible.

While a presently preferred embodiment of my novel method for suppression of non-coupled spins in NMR imaging spectroscopy has been described in detail herein, many variations and modifications will now become apparent to those skilled in the art. It is my intent, therefore, to be limited only by the scope of the appending claims, and not by way of the details and instrumentalities utilized herein by way of description of the presently preferred embodiment.

What I claim is:

1. A method for suppressing, in nuclear magnetic resonance (NMR) investigation of a sample, undesired response signals from nuclei which are not coupled to one another, while obtained desired NMR signals from nuclei which are spin-coupled to one another, comprising the steps of:
   (a) evoking each of respective first and second NMR response signals from the sample responsive to respective first and second excitation signal sequences;
   (b) preceding each of the first and second NMR excitation signal sequences with a different one of an alternating pair of signal subsequences predeterminedly selected for causing each of the excitation sequences to generate response signals which are (1) substantially of the same phase from nuclei with uncoupled spins and (2) substantially of opposite phase from nuclei with coupled spins;
   (c) acquiring the response signals generated in response to the first subsequence and first sequence to form a first set of recovered data;

(d) acquiring the response signals generated in response to the second subsequence and second sequence to form a second set of recovered data;

(e) subtracting one of the first and second data sets from the remaining data set; and (f) generating one of an image and a spectrum of the sample responsive to the difference data set obtained in step (e).

2. The method of claim 1, wherein step (b) includes the steps of: providing a plurality of radio-frequency (RF) pulse signals in each of the subsequences; and providing one of the pair of subsequences with at least one extra RF pulse signal which is not provided to the other subsequence of the pair and which has a different predetermined effect upon each of the spin-coupled nuclei and the non-coupled nuclei of the sample.

3. The method of claim 2, wherein step (b) further comprises the steps of: separating the temporal midpoint of each sequential pair of the plurality of RF pulse signals by time intervals substantially equal to $T=N/(4J)$, where N is an odd integer greater than zero, and J is the constant of coupling between the coupled nuclei.

4. The method of claim 3, wherein step (b) further comprises the step of providing substantially the same time interval T between the temporal midpoint of the final RF pulse signal of that one of the subsequences having the at least one extra RF pulse signal, and the temporal midpoint of a first RF pulse signal of the following imaging sequence.

5. The method of claim 4, wherein step (b) further comprises the step of providing substantially the same time interval T between the temporal midpoint of the first RF pulse signal of each of the pair of imaging sequences and the time at which response signal acquisition of step (c) or (d) commences later in that sequence.

6. The method of claim 5, wherein step (b) also comprises the step of separating the temporal midpoints of the final RF pulse signal in the subsequence devoid of the at least one extra RF pulse signal and the first RF pulse signal of the following imaging sequence by a time interval substantially equal to twice the time interval T.

7. The method of claim 6, wherein $N=1$.

8. The method of claim 3, wherein the step of providing the plurality of RF pulse signals further comprises the steps of: providing a first RF pulse signal to rotate sample nuclei net spin magnetization substantially by 90° about a first axis in a plane; and providing a second RF pulse signal, with a temporal midpoint occurring at substantially the time interval T after the temporal midpoint of the first RF pulse signal, to rotate the spin magnetization of the sample nuclei substantially by 180° about a second axis in the plane of, and substantially orthogonal to, the first axis.

9. The method of claim 8, wherein the first and second RF signal pulses are applied to the sample substantially in the absence of gradient magnetic fields applied to the sample.

10. The method of claim 8, wherein the step of providing at least one extra RF pulse signal comprises the step of providing a third RF pulse signal to rotate the spin magnetization claim of the coupled nuclei substantially by 90° about the second axis.

11. The method of claim 10, wherein the third signal pulse is applied to the sample substantially in the absence of gradient magnetic fields applied to the sample.

12. The method of claim 10, wherein step (b) further comprises the step of providing substantially the same time interval T between the temporal midpoint of the third RF pulse signal of the subsequence having the at least one extra RF pulse signal, and the temporal midpoint of a first RF pulse signal of the following imaging sequence.

13. The method of claim 12, wherein step (b) further comprises the step of providing substantially the same time interval T between the temporal midpoint of the first RF pulse signal of each of the pair of imaging sequences and the time at which response signal acquisition of step (c) or (d) commences later in that sequence.

14. The method of claim 13, wherein step (b) also comprises the step of separating the temporal midpoints of the final RF pulse signal in the subsequence devoid of the at least one extra RF pulse signal and the first RF pulse signal of the following imaging sequence by a time interval substantially equal to twice the time interval T.

15. The method of claim 14, wherein the final RF pulse signal of the subsequence is the second RF pulse signal.

16. The method of claim 14, wherein $N=1$.

17. The method of claim 8, wherein step (b) further comprises the step of providing substantially the same time interval T between the temporal midpoint of the third RF pulse signal of the subsequence having the at least one extra RF pulse signal, and the temporal midpoint of a first RF pulse signal of the following imaging sequence.

18. The method of claim 17, wherein step (b) further comprises the step of providing substantially the same time interval T between the temporal midpoint of the first RF pulse signal of each of the pair of imaging sequences and the time at which response signal acquisition of step (c) or (d) commences later in that sequence.

19. The method of claim 18, wherein wherein step (b) also comprises the step of separating the temporal midpoints of the final RF pulse signal in the subsequence devoid of the at least one extra RF pulse signal and the first RF pulse signal of the following imaging sequence by a time interval substantially equal to twice the time interval T.

20. The method of claim 19, wherein $N=1$.

* * * * *